US006307366B1

United States Patent
Takeda

(10) Patent No.: US 6,307,366 B1
(45) Date of Patent: *Oct. 23, 2001

(54) OBJECT POSITION SENSOR USING MAGNETIC EFFECT DEVICE

(75) Inventor: Nobuhiro Takeda, Kawasaki (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/209,301

(22) Filed: Dec. 11, 1998

Related U.S. Application Data

(62) Division of application No. 08/590,834, filed on Jan. 24, 1996, now Pat. No. 5,886,520.

(30) Foreign Application Priority Data

| Jan. 24, 1995 | (JP) | 7-008950 |
| Jan. 24, 1995 | (JP) | 7-008953 |
| Feb. 9, 1995 | (JP) | 7-021733 |

(51) Int. Cl.[7] ............. G01B 7/14; G01R 33/09; H01L 43/08; G01D 5/18
(52) U.S. Cl. ............. 324/207.21; 324/252; 338/32 R
(58) Field of Search ............. 324/207.21–207.25, 324/173, 174, 252; 338/32 R; 340/870.33, 870.38; 341/15; 360/113; 365/158

(56) References Cited

U.S. PATENT DOCUMENTS

| 4,429,276 | * | 1/1984 | Narimatsu et al. | 324/207.21 |
| 4,480,248 | * | 10/1984 | Sudo et al. | 324/207.21 X |
| 4,639,807 | * | 1/1987 | Sekizawa et al. | 324/207.21 X |
| 4,801,881 | * | 1/1989 | Kawata | 324/207.21 |

FOREIGN PATENT DOCUMENTS

| 159108 | * | 12/1980 | (JP) | 324/207.21 |
| 223218 | * | 8/1992 | (JP) | 324/207.21 |

* cited by examiner

Primary Examiner—Gerard R. Strecker
(74) Attorney, Agent, or Firm—Robin, Blecker & Daley

(57) ABSTRACT

A position sensor comprising a scale structure 7 having magnetic poles positioned with a predetermined distance alternatively magnetized poles one to another, at least two magnetic sensing elements M11 and M12 having a resistance variable in response to the magnetic field of the scale structure, and external connecting terminals 14, 15, and 16 are connected for applying a voltage and for producing an output signal from the intermediate terminal. The terminals each is formed to have a width in the direction in parallel to the magnetic field being 2m times the pole width (m=1, 2, 3, . . . ) of the scale structure, thereby the terminals being prevented from the effect of resistance variation by the magnetic field to provide a position information with an increased accuracy.

8 Claims, 16 Drawing Sheets

OBJECT POSITION SENSOR USING MAGNETIC EFFECT DEVICE

CROSS-REFERENCE TO RELATED APPLICATION

This application is a divisional of application Ser. No. 08/590,834, filed Jan. 24, 1996, now U.S. Pat. No. 5,886,520.

BACKGROUND OF THE INVENTION

1. Field of the Invention

The present invention relates to a position sensor for detecting a position of an object, and more particularly to a position sensor having one or more magnetic resistance effect devices (hereinafter referred to as a "MR device"), which detects a position for an object with high precision and resolution.

2. Brief Description of the Related Art

A lens system having a zoom function and a focus function is an example of a device which requires detecting a position with high resolution. In the lens system, the distance to the subject and the position of the zoom lens and the focus lens must be at the predetermined position which the lens design determines. In order to determine the predetermined position, a method of using a mechanical cam or a method of using an electronic cam which detects the position of the zoom lens and focus lens and controls them by computing has been used in recent years.

However, the method of using a mechanical cam has problems, such as making the device with a large dimension and degrading the precision due to mechanical wear.

Methods of using an electronic cam include a method of using a potentiometer as the position detector, and a method of counting control signals of a stepping motor which is used as the driving motor for the lens. In the first method mentioned above, there are problems such that the load applied on the motor is increased since the method is of a contact, the linearity is worsened due to dispersion of the resistance film, and reliability is unsatisfactory. In the case of the second method using a stepping motor, a lens system using a stepping motor is merely applicable, and errors can be caused if there is an object between the motor and the lens, such as a gear due to a play existing therebetween.

In order to overcome the aforementioned problems, there can be a method of using a MR device for position detection, utilizing the property that the resistance value of the MR device varies in response to a change of a magnetic field. There is, for instance, a method in which a magnet is disposed on the lens side, a MR device is installed, and the lens together with the magnet is moved with respect to the MR device, thus the resistance variation is produced as the position variation.

The conventional methods of position detection using MR devices are described with reference to the following two examples.

FIG. 13 illustrates a pattern formed of a MR device utilized in the first example. The MR device includes two magnetic sensing elements M71 and M72, which are formed of a ferromagnetic thin film of, for example, nickel-iron alloy deposited on a glass substrate by vacuum evaporation or sputtering, and thereafter formed two parallel thin strips that meet at a folded point 71 by etching or the like process. The folded point 71 is formed thicker to reduce the resistance value. Magnetic sensing elements M71 and M72 are formed as elongated in the direction perpendicular to the magnetic field of the scale structure 7 in order to cause resistance change in response to the field. A connecting lead 72 and a wiring lead 73, for connecting the sensing elements M71 and M72 as well as for connecting the elements M71 and M72 with external connecting terminals, which will be hereinafter described, are formed of the same ferromagnetic thin film as the sensing elements M71 and M72. The connecting lead 72 is formed in the direction along which a resistance change would not be caused, namely in the same direction as that of the magnetic field of scale structure 7. The connecting lead 72 and wiring lead 73 are thickened in order to lower the connecting resistance. External connecting terminals include those 74 and 76 for applying a source voltage for the MR device, and a terminal 75 for producing an output signal. These terminals 74, 75 and 76 are also formed of ferromagnetic thin film same as the magnetic sensing elements M71 and M72. The scale structure 7 includes N- and S-poles, each being formed alternatively in the opposite polarity with a predetermined distance P as shown in FIG. 13.

FIG. 14 shows an equivalent circuit to the MR device of this first embodiment, and FIG. 15 shows the relationship between the sensing elements M71 and M72 of the MR device and an output signal of the MR device. The sensing elements M71 and M72 are formed with a distance of p/2 apart so as to generate a sine wave output signal.

FIG. 16 illustrates a pattern formed of a MR device utilized in the second example. The MR device includes four magnetic sensing elements M81, M82, M83 and M84, which are formed of a ferromagnetic thin film of, for example, nickel-iron alloy deposited on a glass substrate by vacuum evaporation or sputtering, and thereafter formed two parallel thin strips by etching or the like process. A folded point 81 is formed thicker to reduce the resistance value. Magnetic sensing elements M81 to M84 are formed as elongated in the direction perpendicular to the magnetic field of the scale structure 7 in order to cause resistance change in response to the field. Each connecting lead 82 for connecting the sensing elements M81 to M84 is formed of the same ferromagnetic thin film as the sensing elements M81 to M84. The connecting lead 82 is formed in the direction along which a resistance change would not be caused, namely in the same direction as that of the magnetic field of scale structure 7. The connecting lead 82 and wiring lead 83 are thickened in order to lower the connecting resistance. External connecting terminals include those 84 and 86 for applying a source voltage for the MR device, and a terminal 85 for producing an output signal. These terminals 84, 85 and 86 are also formed of ferromagnetic thin film same as the magnetic sensing elements M81 and M82. The following connections including: the magnetic sensing element M84 with the terminal 86; and the connecting lead 82 between the elements M82 and M83 with the terminal 85; are formed by each associated wiring lead 83 respectively. The scale structure 7 includes N- and S-poles, each being formed alternatively in the opposite polarity with a predetermined distance P.

FIG. 17 shows an equivalent circuit to the MR device of this second example, and FIG. 18 shows the relationship between the sensing elements M81 to M84 of the MR device and an output signal of the MR device. For the purpose to eliminate the error produced in the boundary region between an N-pole and an S-pole adjacent to each other, the magnetic sensing elements M81 and M82 are formed away from each other by the same distance as the pole width P, and, also the magnetic sensing elements M83 and M84 are formed in the same manner. In order to produce a sine output signal, the one magnetic sensing group, comprising the elements M81 and M82, and the other sensing group, comprising the elements M83 and M84, are formed. With a distance of p/2 apart so as to generate a sine wave output signal.

The output signals are converted to pulse signals, whose edges are measured to obtain the position 10 information, and, by interpolation the output signal curve in the analog form, a position information with further increased resolution can be obtained.

In the example above, the resistance variation can be caused by the magnetic field in either of magnetic sensing elements M71, M72 and M81 to M84, connecting terminals 74, to 76 and 84 to 86 or wiring leads 73 and 83.

In particular, since the wiring leads 73 and 83 are formed in the direction orthogonal to the magnetic field of scale structure 7, the resistance variation at this region is so large that the correct position information cannot be obtained.

The MR device can exhibit the resistance change of different hysteresis characteristics between the courses of increasing and decreasing steps of the magnetic field applied on the MR device. FIG. 19 shows the resistance variation by the magnetic field applied in the orthogonal direction on a MR device, and the hard lined and the dotted lined curves show such a resistance variation in the cases of during the decreasing and increasing magnetic field intensity, respectively. Both the wiring leads 73 as well as 83 are formed without taking consideration of such characteristics. Therefore, in a position detection of higher precision, the measuring error is inevitable.

Further, the extent of the resolution is around ¼ of the magnet width at best. Also, in the case of interpolating the output curve, the position information is affected by a degree of sine wave distortion. As a result, by the conventional method, the measuring error is inevitable in a position detection of higher precision.

SUMMARY OF THE INVENTION

An object of the present invention is to provide a magnetic resistance effect device, minimizing the influence of a resistance change caused by a magnetic field, capable of obtaining a positional information with higher accuracy.

Another object of the present invention is to provide a magnetic resistance effect device of high accuracy free from any effect caused by hysteresis characteristics.

A further object of the present invention is to provide a magnetic resistance effect device capable of obtaining an output signal free from the waveform distortion.

A still further object of the present invention is to provide a magnetic resistance effect device exhibiting high reliability and high resolution ability.

To achieve the aforementioned objects, the magnetic resistance effect device according to the invention comprises: (a) at least a pair of magnetic sensing elements whose resistance value varies in response to a magnetic field of a scale structure including a pair of magnetic poles alternatively magnetized with a predetermined distance therebetween, and the elements being connected in series to each other; (b) a voltage is applied between the elements at both ends; and (c) an output voltage is obtained from a middle point of the element connection wherein each of the terminals have a width in parallel with the direction of the magnetic field being $2a$ times a width of a zone where each of the magnetic poles is formed, where the numeral "a" is an integer selected from the numerical group including 1, 2, and more.

Another structure of the magnetic resistance effect device comprises: (a) at least a pair of magnetic sensing elements whose resistance value varies in response to a magnetic field of a scale structure including a pair of magnetic poles alternatively magnetized with a predetermined distance therebetween, and the elements being connected in series to each other; (b) a voltage is applied between the elements at both ends; (c) an output voltage is obtained from a middle point of the element connection; wherein, wiring leads are formed in the direction orthogonal to the magnetic field; each of the wiring leads has a width extending in the direction parallel to the magnetic field, and wherein each of the wiring leads have the width in parallel with the direction of the magnetic field being $2b$ times a width of a zone where each of the magnetic poles is formed, where the numeral "b" is an integer selected from the numerical group including 1, 2, and more.

By constructing the device as mentioned above, the external connection terminal and/or the wiring portion is free from any effect of the magnetic field, and accordingly a position information with high accuracy can be obtained.

Another construction of the magnetic resistance device includes a plurality of magnetic sensing groups, each of said magnetic sensing groups including at least two magnetic sensing elements, each of whose resistance value is variable in response to a magnetic field generated in a scale structure including a plurality of magnetic poles which are spaced with a predetermined distance therebetween and are magnetized alternatively to each other, said at least two magnetic sensing elements arranged spaced apart from each other by substantially the same distance as a width of a zone where each of the magnetic poles is formed, each of said sensing groups arranged spaced apart from each other by substantially a half of the width, wherein a voltage is applied at both ends of each pair of said sensing group and an output is obtained from an intermediate point; and a plurality of wiring leads for applying the voltage and producing the output, among said wiring leads, those formed in the direction orthogonal to said magnetic field are formed of a plurality of wiring groups, and a pair of wiring groups, for each group of the sensing elements, arranged spaced apart from each other by substantially the same distance as said width.

Arranged in such a manner, the hysteresis characteristics are eliminated thus a position information with the high precision can be obtained.

The positional relationship between the magnetic sensing elements, included in the aforementioned sensing group, and the wiring arrangement, in the direction orthogonal to the magnetic field of the scale structure, may be preferably formed away from each other by the amount of n times the pole width, where n=0, 1, 2, . . . .

Thus, the signal representing the magnetic resistance change produced within the magnetic sensing group and that produced within the wiring arrangement are of the same phase with each other, and, accordingly, the sine waves having the different phase to each other would not be superimposed, and an output signal free from any waveform distortion can be obtained.

Preferably, the magnetic sensing elements, external connecting terminals, and the wiring arrangement are formed of a ferromagnetic thin film.

The invention also provides a position sensor apparatus having an extremely high precision comprising the scale structure as mentioned above, and sensor means including magnetic resistance effect elements.

Such a sensor apparatus of the invention is composed of a scale structure having magnetic zones alternatively poled in the opposite direction to each other and at least two magnetic sensing elements connected together in series, wherein a source voltage is applied at both ends of the elements, and an output signal is produced at the intermediate point. Further, four magnetic resistance effect elements are arranged so as to be shifted with each other by ⅛ the pole width, and each phase including four phases are respectively computed to detect the position.

Subsequently, two sets of eight phased signals are computed, and, using the signals having substantially the same phase, the position is detected. Of the signals, when the value of either one becomes zero, and also the remaining signal value is smaller than the predetermined value, such a value is decided as the position information. When the remaining signal exceeds the predetermined value, each of four phased signals is adjusted, re-calculated and again the position information is detected.

Furthermore, two sets of eight-phased signals are computed from each of the aforementioned signals, the signals having substantially the same phase are added with each other. In addition, the same-phased signals are added after adjustment so as to have the amplitude substantially the same.

Accordingly, a position detection with the high accuracy becomes possible, thereby the error components of the information are reduced and reliability is increased.

The above and other objects and features of this invention will become apparent from the following detailed description of embodiments thereof taken in connection with the accompanying drawings.

DETAILED DESCRIPTION OF THE PREFERRED EMBODIMENTS

Figure 1:
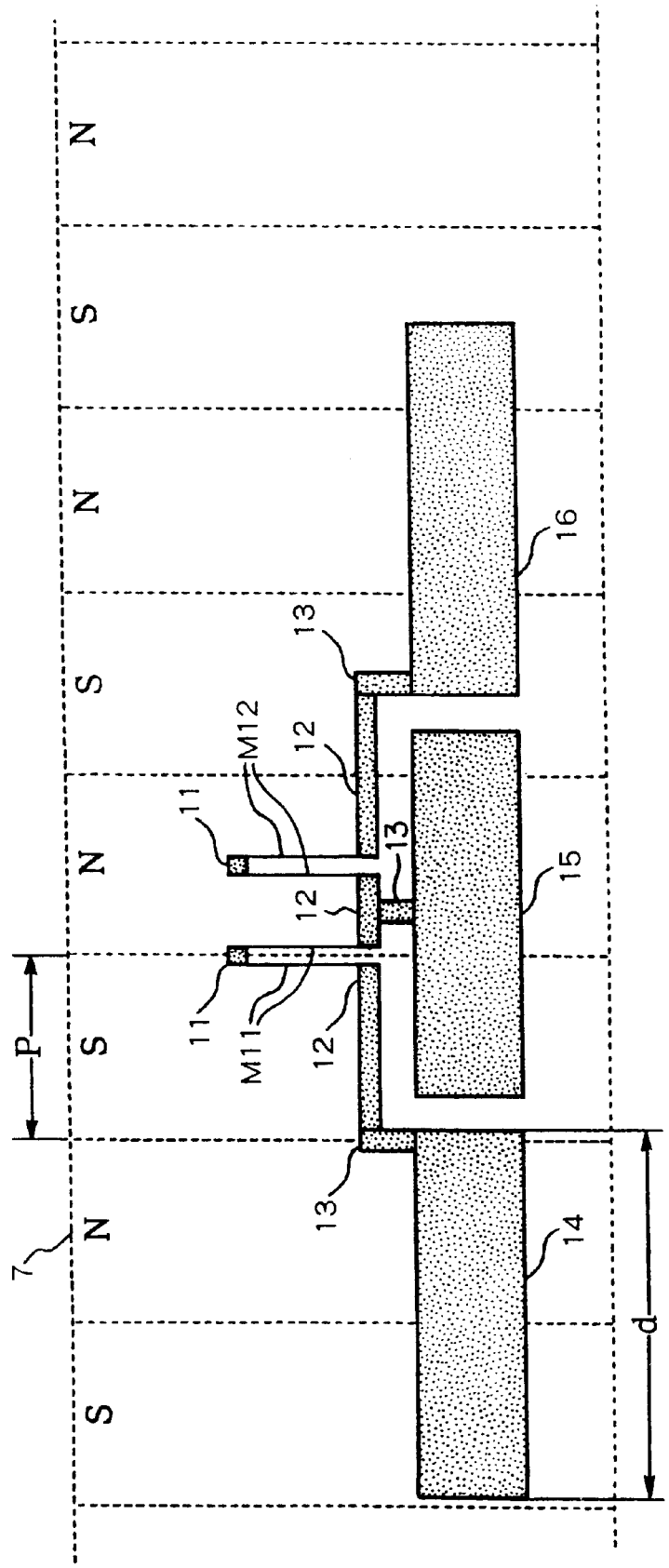
FIG. 1 is a pattern of a MR device of the first embodiment according to the invention.

Referring now to the drawings, the MR device and the position sensor apparatus according to the present invention are hereinafter described in detail.

First, the embodiments of the invention are described in accordance with the following five embodiments.

First Embodiment

FIG. 1 illustrates a pattern of a MR device formed as a first embodiment of the present invention. The MR device comprises a pair of magnetic sensing elements M11 and M12, which are formed by way of vacuum evaporation or sputtering in a magnetic field, on a not illustrated glass substrate, as a ferromagnetic film such as an iron-nickel alloy film with a thickness of about 500 to 1000 Angstrom, and two parallel-formed leads of about 10 micron meter (hereinafter, abbreviated as "micron") in width having a folded point is formed at the end of the leads by way of etching or any other process. The folding point 11 is formed in a broadened width of 100 micron for reducing the resistance value. In order to provide a proper resistance variation in accordance with the magnetic field, the sensing elements M11 and M12 are formed elongated in the direction perpendicular to that of the scale structure 7.

On the other hand, a connecting lead 12 or a wiring 13, the former for connecting the sensing elements M11 and M12 to each other, and the latter for connecting these elements M11 and M12 with the thereafter describing external connecting leads, is formed of a ferromagnetic film the same as that of magnetic sensing elements M11 and M12. Connecting lead 12 is formed in the direction in which no resistance change is produced by the magnetic field, that is, in the direction parallel with that of the field generated in scale structure 7. Also, to reduce the resistance value, the connecting lead 12 and wiring 13 are formed to have a broader width of about 100 micron. Numerals 14 and 16 are external connecting terminals for applying a source voltage, and 15 is a terminal for obtaining an output signal, and these terminals 14, 15 and 16 are formed of the same ferromagnetic thin film as that of magnetic sensing elements M1 and M2, each of these terminals has a width "d" in the direction of parallel to the magnetic field, of 2m times the width P (hereinafter, sometimes referred to as "a pole width") of a single pole zone in scale structure 7, wherein m=1, 2 or more integer, and m=1 corresponds to the embodiment. The scale structure includes N- and S-poles, each being formed alternatively in the opposite polarity with the predetermined distance as shown in FIG. 1.

Figure 2:
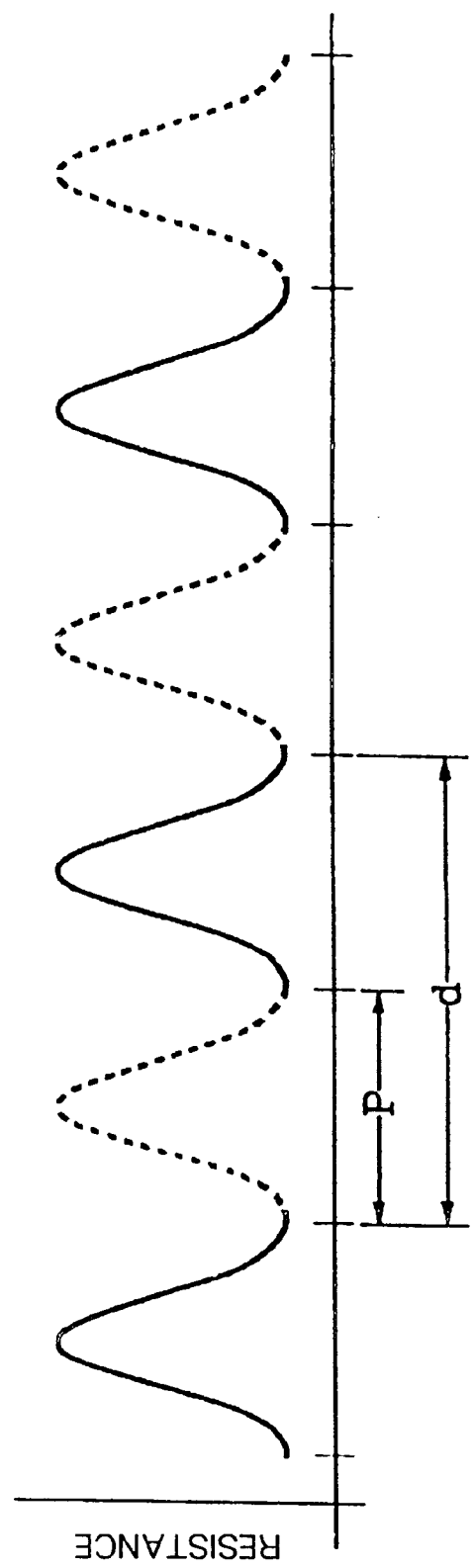
FIG. 2 shows a resistance change using a scale formed in a width of a pole width P.

FIG. 2 illustrates the resistance change provided when a magnetic field is applied on the MR elements, using a scale structure formed of a pole width P. Since the MR device can exhibit the resistance change of different hysteresis characteristics between the courses of increasing and decreasing steps of the magnetic field applied on the MR device, as shown in the figure where the different waveforms are exhibited in solid lines and in dotted lines, respectively.

Each resistance, corresponding to the mean resistance value over the range "c" of terminals 14, 15 and 16 becomes constant, since the range "c" is 2m times of the distance p corresponding to one cycle of the wave form.

Accordingly, an error component resulting from the resistance variation existing in terminals 14, 15 and 16 is reduced, thereby providing an increased accuracy in the position information.

Second Embodiment

Figure 3:
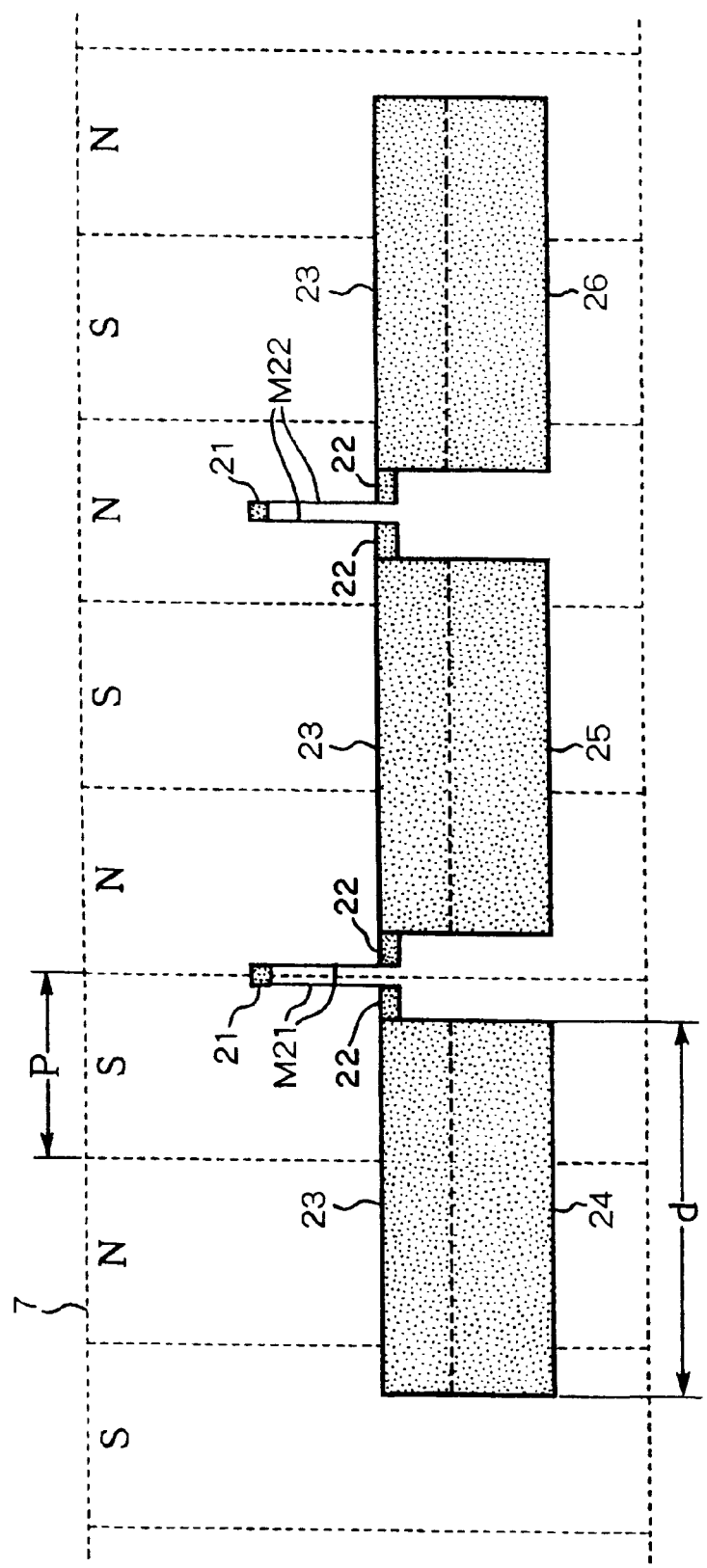
FIG. 3 is a pattern of a MR device of the second embodiment.

FIG. 3 shows a pattern of a MR device as a second embodiment, wherein the construction including sensing elements M21 and M22 and the scale structure is the same as those in the first embodiment.

Also, as shown in FIG. 3, wiring 23 are formed in the direction perpendicular to the direction of the magnetic field formed in scale structure 7, and is also formed of a ferromagnetic thin film, the same as that of sensing elements M21 and M22, each of these wirings has a width "d" in the direction of parallel to the magnetic field 2n times the pole width P, where n=1, 2 or any other integer, wherein n=1 corresponds to the present embodiment. Connection leads 2 are also formed by the same way. External connecting terminals include terminals 24 and 26 for applying a source voltage, and a terminal 25 for obtaining an output signal from the MR device, all of which terminals also are formed of a ferromagnetic thin film as sensing elements M21 and M22, and the width of which in the direction parallel with the magnetic field of scale structure 7 is 2m times the pole width P, where m=1, 2 or any other integer, wherein m=1 corresponds to the present embodiment.

Accordingly, any of resistance variations likely to occur in terminals 24, 25 and 26 as well as in wiring arrangement 23 due to the influence by the magnetic field in scale structure 7 is prevented, thereby to maintain a definite resistance value. In such a manner, any error component is minimized to provide a positional information with more increased accuracy.

Third Embodiment

Figure 4:
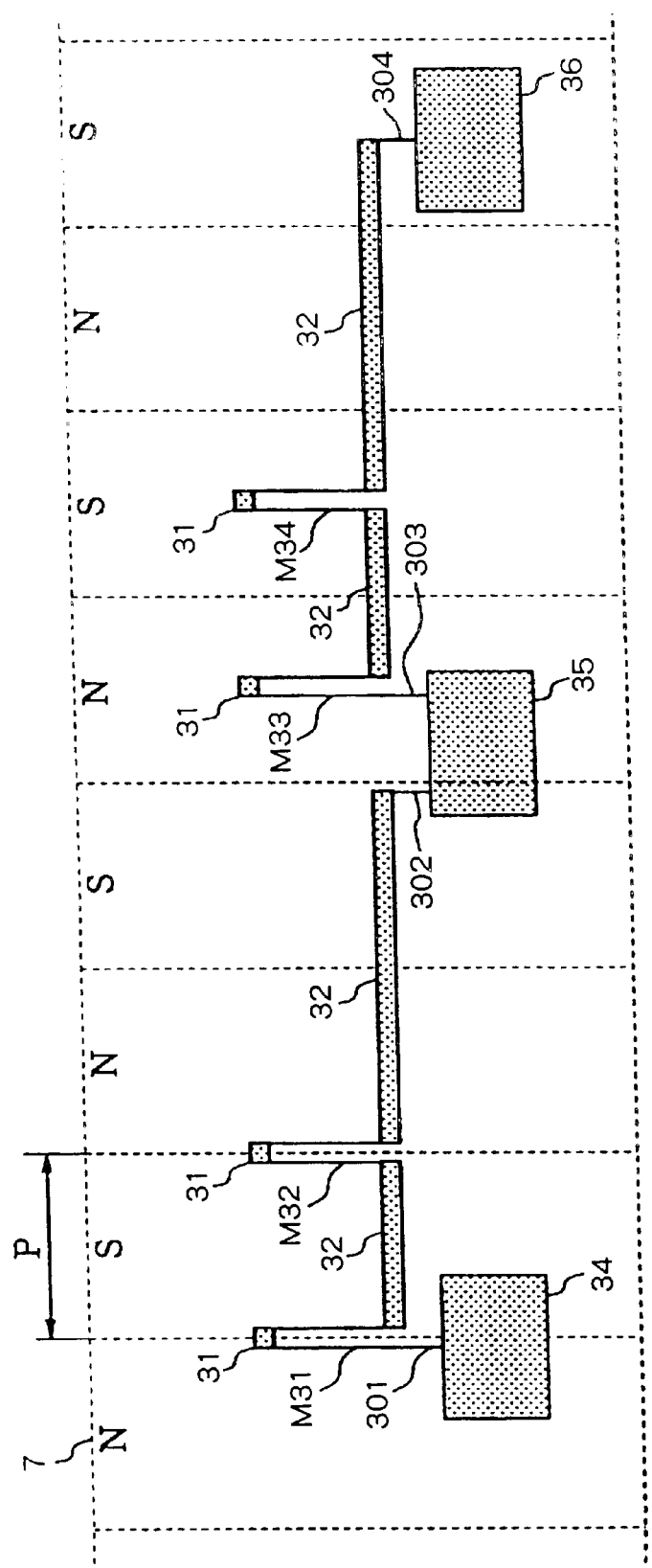
FIG. 4 is a pattern of a MR device of the third embodiment.

In the pattern of a MR device of the third embodiment shown in FIG. 4, the MR device includes four magnetic sensing elements M31, M32, M33 and M34, which are formed by vacuum evaporation or sputtering in a magnetic field, with a. ferromagnetic, such as of iron-nickel alloy, thin film deposited on a glass substrate to a thickness of 500 to 1000 Angstrom, followed by forming two leads of a width of 10 micron so as to have a folded point 31 at one end having a width of approximately 100 micron for sufficiently reducing the connecting resistance through etching or any other process. The magnetic sensing elements M31 to M34 are formed as elongated in the direction perpendicular to that of the magnetic field so as to cause a resistance change by the magnetic field in the scale structure (magnet) 7.

On the contrary, the connecting lead 32 is formed in the direction in parallel with that of the magnetic field so as not to cause any resistance change by the magnetic field in the scale structure 7, and is formed to have a width of approximately 100 micron for sufficiently reducing the lead resistance. External connecting terminals include terminals 34 and 36 for applying a source voltage, and a terminal 35 for obtaining an output signal from the MR device, all of which terminals also are formed of a ferromagnetic thin film as magnetic sensing elements M31 to M34. Sensing elements M31, M32, M33 and M34 are, respectively, connected to the terminals 34, 35 and 36, also respectively by way of each of wiring leads 301, 302, 303 and 304, each of which leads is also formed of a ferromagnetic thin film as magnetic sensing elements M31 to M34, and having a width of about 10 micron.

In order to eliminate the error occurring in the area of the boundary between the adjacent N- and S-poles, the magnetic sensing elements M31, M32, M33 and M34 are formed such that the sensing elements M31 and M32, as well as the elements M33 and M34, that is, each of the adjacent elements is respectively disposed away from each other with the distance which corresponds to the pole width P. In addition, in order to permit an output signal to have properly a sine waveform, the first group including elements M31 and M32 and the second group including elements M33 and 34 are disposed with a phase difference of substantially P/2 from each other.

In the first group above, wiring leads 301 and 302 are formed with a phase difference by the amount of the pole width P, that is, disposed from each other by the distance of m times the pole width P, where m=1, 3, 5 or any other integer, wherein m=3 corresponds to the present embodiment. In such a construction, when the wiring lead 301 is applied with a magnetic field of increasing state, the lead 302 is applied with a field of decreasing state, thereby the hysteresis characteristics, caused by the difference of hysteresis between the periods of increasing and decreasing of the magnetic field, being eliminated. Also, in the second element group, the wiring leads 303 and 304 are formed essentially with a phase different from each other by the amount of the pole width P. Accordingly, when the wiring lead 303 is applied with a magnetic field of increasing state, the lead 304 is applied with a field of decreasing state, thereby the hysteresis characteristics being advantageously eliminated for the same reason as above.

As described above, any error caused by the hysteresis which occurs in wiring leads 301, 302, 303 and 304 in the course of magnetic resistance change can be prevented to enable a position detection with high accuracy.

Fourth Embodiment

Figure 5:
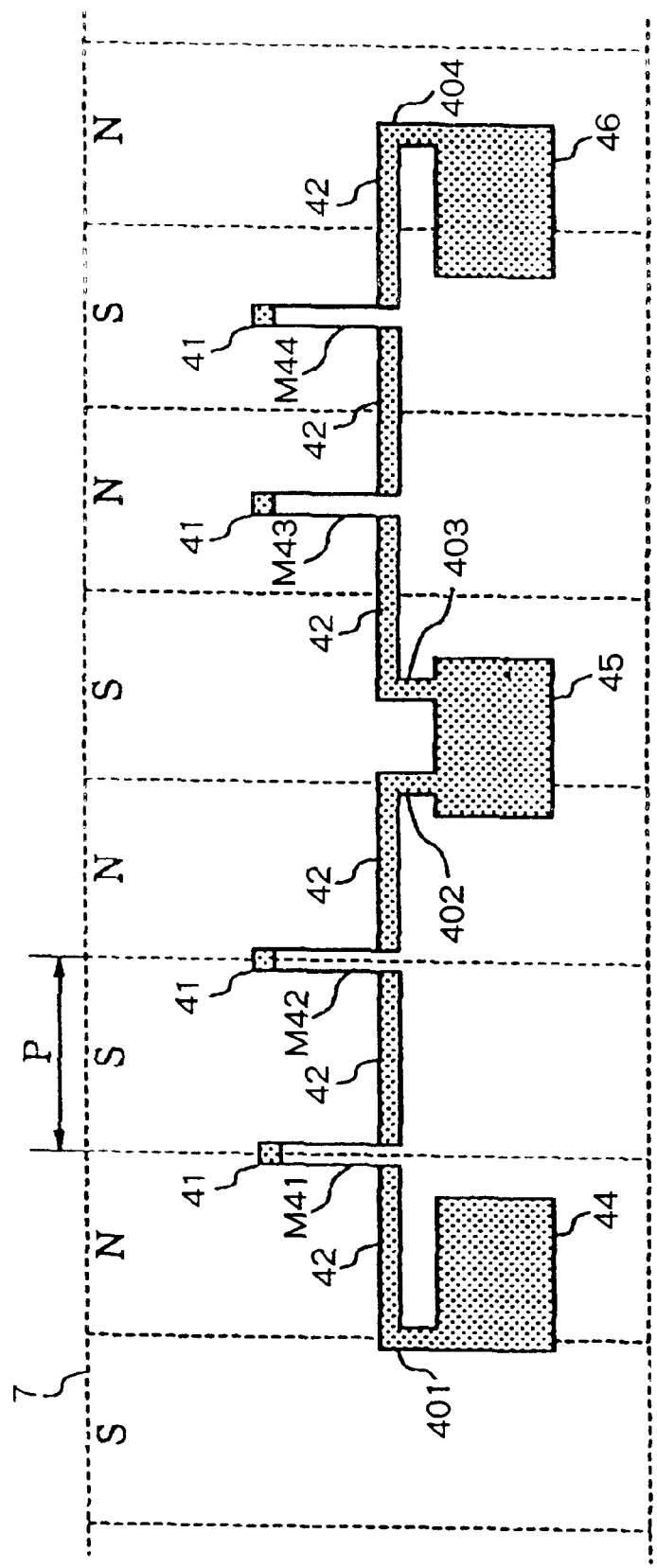
FIG. 5 is a pattern of a MR device of the fourth embodiment.

In the pattern of a MR device of the fourth embodiment shown in FIG. 5, the arrangement including magnetic sensing elements, connecting leads and a scale structure is the same as that in FIG. 1.

In FIG. 5, wiring leads 401, 402, 403 and 404 are formed in the direction perpendicular to that of the magnetic field formed in scale structure 7, and each of these is formed of the same ferromagnetic thin film magnetic sensing elements M41 to M44, having a broader width of about 100 micron in order to reduce the resistance value.

A connecting lead 42 is formed in the direction in parallel with that of the magnetic field so as not to cause any resistance change by the magnetic field in the scale structure 7, and is formed to have a width of approximately 100 micron for sufficiently reducing the lead resistance. Connecting terminals 44 and 46 for applying a source voltage and a terminal 45 for obtaining an output signal from the MR device are also formed of a ferromagnetic thin film as magnetic sensing elements M41 to M44. Sensing elements M41, M42, M43 and M44 are respectively connected to the terminals 44, 45 and 46, also respectively by way of each of wiring leads 401, 402, 403 and 404, which are also formed of a ferromagnetic thin film as magnetic sensing elements M41 to M44, and having a width of approximately 10 micron.

In the same manner as in FIG. 4, in the first sensing group including magnetic sensing elements M41 and M42, all wiring leads 401 and 402 are formed with a phase difference from each other by the amount of the pole width P (e.g. three times the pole width P in the embodiment), thereby the hysteresis generated in wiring leads 401 and 402 being eliminated.

The left magnetic sensing element M41 and the left wiring lead 401 are formed with a phase difference from each other by the amount of n times the pole width P (where n=0, 1, 2, 3, . . . ), e.g. these being spaced apart from each other by a pole width P. The other element M42 and the wiring lead 402 are also spaced apart from each other by a distance corresponding to the amount of the width P. Under this condition that the element M42 and the lead 402 are essentially at a phase difference from each other by the amount of the pole width P. Accordingly, the magnetic resistance change, caused in the wiring leads 401 and 402, and the change, caused in the magnetic sensing elements M41 and M42, are in the same phase to each other.

The wiring leads 403 and 404 are also formed in the same manner as that in the first group above, and therefore the hysteresis characteristics is advantageously eliminated. Also, the magnetic resistance change, caused in the wirings 403 and 404, and the change, caused in the magnetic sensing elements M43 and M44, are in the same phase to each other.

In this embodiment, the signal of a magnetic resistance change produced in the element group including elements M41 to M44 and the other signal produced in the wiring leads 401 to 404 are in the same phase. Therefore, a plurality of sine signals having different phases would not superimposed with each other, and an output signal having a distortion-free waveform can be obtained.

Fifth Embodiment

Figure 6:
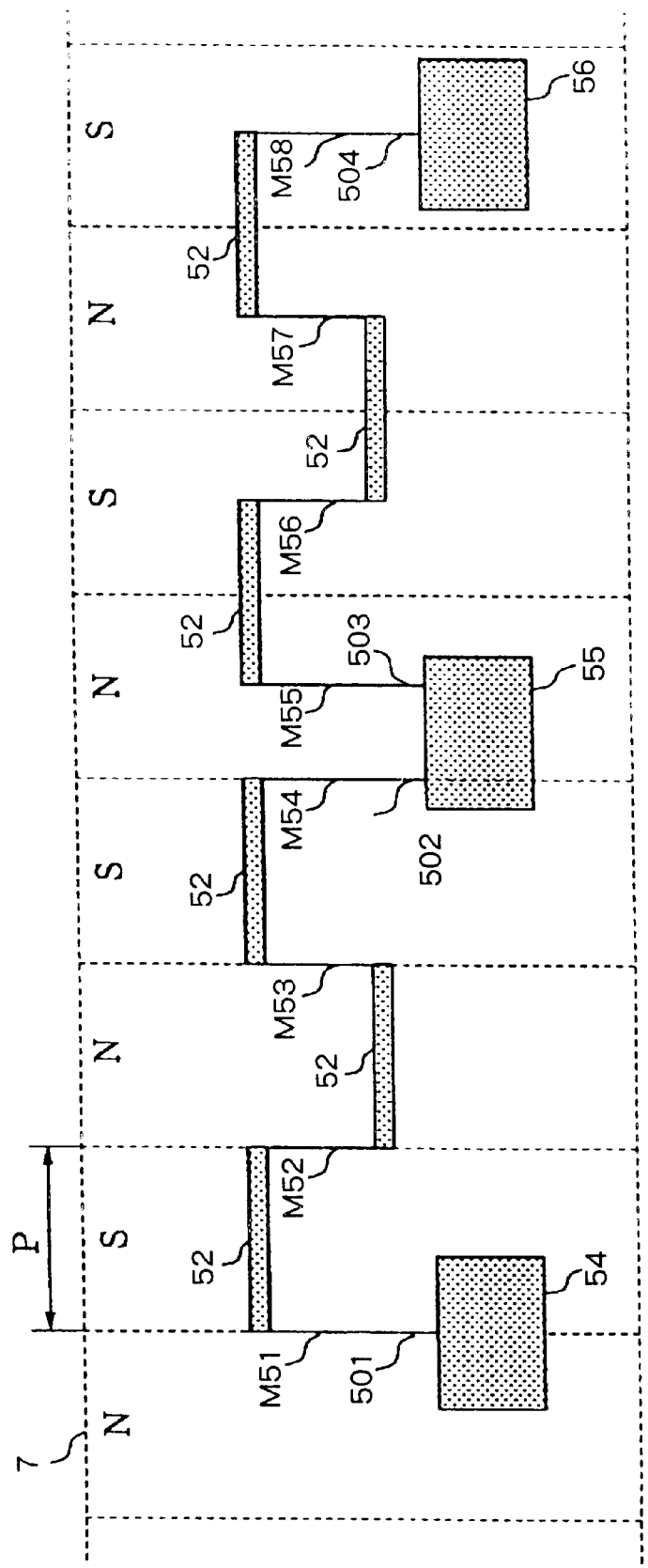
FIG. 6 is a pattern of a MR device of the fifth embodiment.
Figure 7:
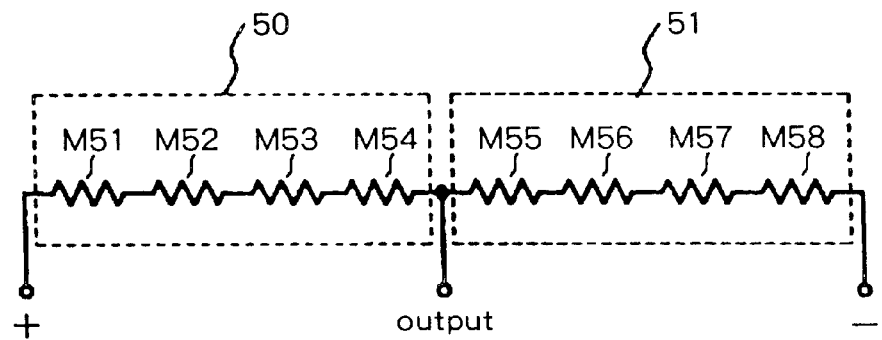
FIG. 7 is an equivalent circuit to an MR device of the fifth embodiment.

In the pattern of a MR device of the fifth embodiment shown in FIG. 6, the arrangement including eight magnetic sensing elements M51, M52, M53, M54, M55, M56, M57 and M58 is the same as the elements M31 to M34 in the forgoing third embodiment, while each of elements is formed as a single strip. In FIG. 7 an equivalent circuit to this embodiment is shown.

Connecting leads between each of adjacent elements and external connecting terminals are formed in the same manner as is in the embodiment 3. A magnetic sensing element M51 and a terminal 54 are connected by a wiring lead 501. The other components are also connected to each other in such a manner that: an element M54 and a terminal 55 with a wiring lead 502; an element M55 and a terminal 55 with a wiring lead 503; and an element M58 and a terminal 56 with a wiring lead 504. The wiring leads 501, 502, 503 and 504 are formed of the same material thin film as the sensing elements M51 to M58, having a line width of 10 micron.

Magnetic sensing elements M51, M52, M53 and M54 are formed spaced apart from each other by the amount of the pole width P of scale structure 7, and magnetic sensing elements M55, M56, M57 and M58 are also formed spaced apart from each other by the amount of the pole width P of scale structure 7. The first element group including elements M51, M52, M53 and M54, and the second element group including those M55, M56, M57 and M58 are placed from each other essentially with a phase difference by the amount of the pole width P/2.

In the first group, the wiring leads 501 and 502 are formed apart essentially from each other with a phase difference by the amount of the pole width P, namely being away from each other with a phase difference by the amount of m times of the- pole width P, namely being away from each other with the distance by the amount of m times the pole width P, where M=1, 3, 5, especially 3 times the width P in this fifth embodiment.

In the same manner in the second group, the wiring leads 503 and 505 are essentially formed with a phase difference by the amount of the pole width P, namely being away with the distance by the amount of m times the width P, e.g. 3 times the pole width P in the embodiment.

In addition, the sensing element M51 and the associated wiring lead 501 are formed essentially with the same phase with each other or of the shifted phase by the amount of pole width P, namely being disposed away from each other by the amount of n times the pole width P, where n=0, 1, 2, 3, . . . , especially disposed in the same position in the case of the embodiment.

Also, the sensing element M55 and the associated wiring lead 503 are formed essentially with the same phase with each other or of shifted phase by the amount of width P, especially disposed in the same position in the case of the embodiment.

In this manner, since each of magnetic sensing elements M51, M52, M53, M54, M55, M56, M57 and M58 is formed as a single straight strip, and the range over which the magnetic field is integrated corresponding to the line width of the sensing elements, the magnet having a further sufficient thinner width can be utilized.

The increased number of elements also contributes to correct the errors generated in the boundary region between N- and S-poles.

Also, wiring leads 501 to 504 as well as magnetic sensing elements N51 to M58, having the same strip width and formed in the same phase with each other, serve to prevent superimposition of sine waves of different waveforms to produce an output waveform free from waveform distortion.

A position detector utilizing a MR sensor device of the invention is described below with reference to the embodiments. Either of the aforementioned MR sensors or of the hereinafter described sensor may form the position detector.

Figure 8:
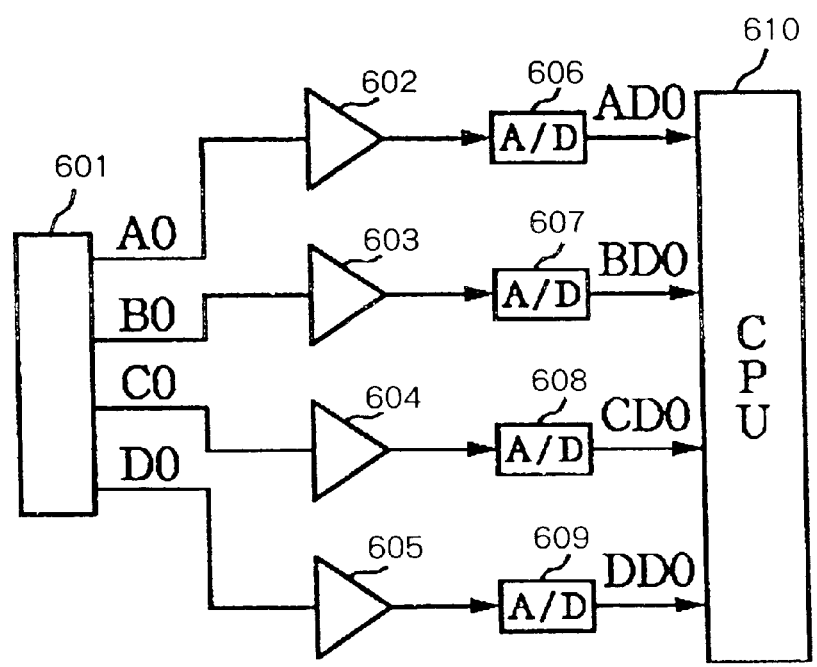
FIG. 8 is a circuit structure of a position sensor apparatus using a MR sensor of the invention.

FIG. 8 shows a circuit structure comprising a MR sensor 601, whose output signals AO, BO, CO and DO are coupled through amplifiers 602, 603, 604 and 605 to A/D converters 606, 607, 608 and 609, respectively. The digitally converted signals are inputted to a CPU 610 and a plurality of position signals are computed.

Figure 9:
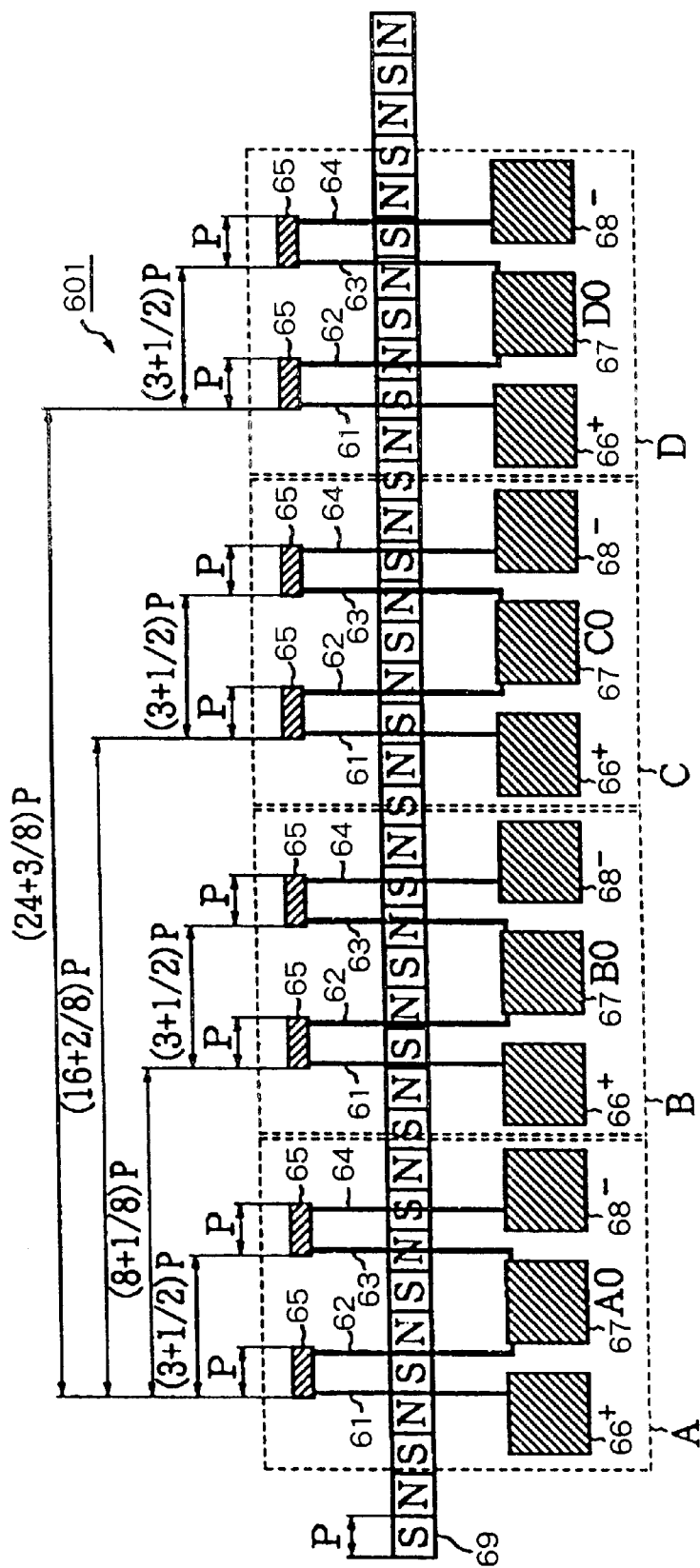
FIG. 9 is a pattern of a MR sensor of the invention.

FIG. 9 is a pattern to form the MR sensor 601, including four MR devices A, B, C, and D, each further including four magnetic sensing elements 61, 62, 63 and 64. These elements 61, 62, 63 and 64 are formed of ferromagnetic thin film, such as of iron-nickel alloy, in a magnetic field by vacuum evaporation or sputtering on a not illustrated glass substrate for a thickness of about 500 to 1000 angstrom, and are formed of a width of 10 micron through etching or any other process, and are also formed as extending in the direction orthogonal to the magnetic field of the scale structure (magnet) 69 in order to cause a resistance change according to the effect of the same magnetic field.

On the other hand, connecting leads 65 are formed of the same ferromagnetic thin film as the sensing elements 61, 62, 63 and 64, and are, in order not to produce any resistance change caused by the magnetic field of the scale 69, formed in the direction in parallel with the magnetic field. Also, in order to reduce the resistance value, the connecting lead 65 is formed to have a sufficient width of about 100 micron. External connecting terminals including those 66 and 68 for applying a source voltage for the MR device, and a terminal 67 for producing an output signal, are also formed of a ferromagnetic thin film the same as sensing elements 61 to 64. Magnetic sensing elements 61, 62, 63 and 64 are formed such that the elements 61 and 62, as well as elements 63 and 64, that is, each of the adjacent elements are respectively disposed away from each other by the pole width P, where M=1, 3, 5, . . . ; wherein M=1, corresponding to a pole width P in the embodiment.

Further, in order to produce a sine waveform output, the first group including elements 61 and 62 and second group including elements 63 and 64 are formed essentially with a phase difference by the amount of P/2, that is, shifted by $(n+\frac{1}{2})$ times the width P, where n=0, 1, 2, . . . ; wherein $n=(3+\frac{1}{2})$ corresponds to the embodiment. On the other hand, the output signals A, B, C and D are formed so as to be shifted in phase with respect to each other by $\frac{1}{8} \times P$ in order to produce four phase position signals.

Figure 10:
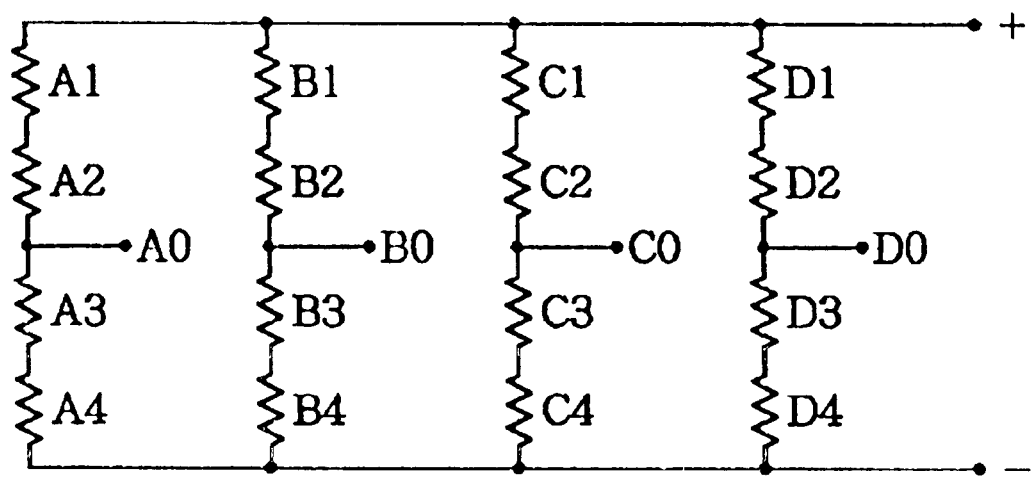
FIG. 10 is an equivalent circuit to an MR sensor.
Figure 11:
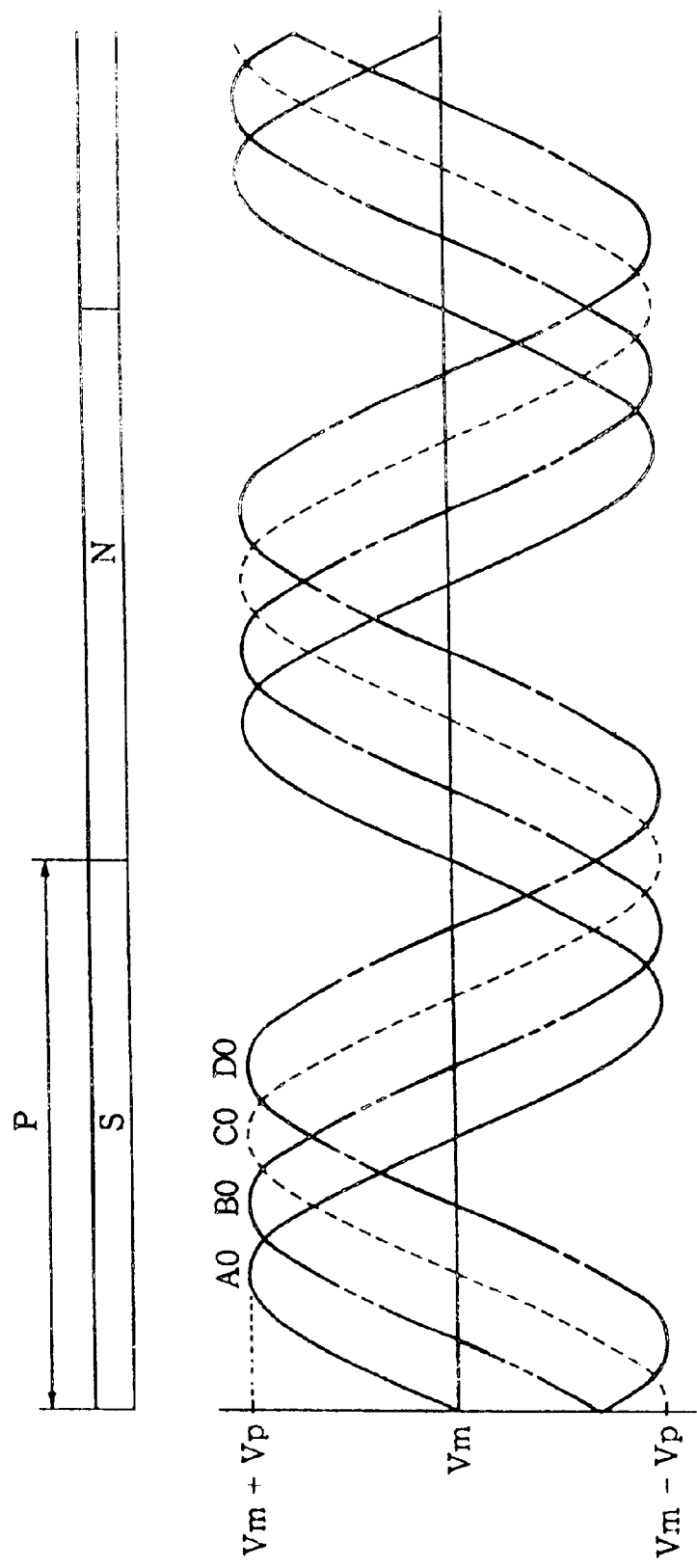
FIG. 11 is the waveform of output signals.

Next, in describing the operation of the position detector, FIG. 10 shows an equivalent circuit to the MR sensor 601 of FIG. 9, and FIG. 11 shows waveforms of each output signal AO, BO, CO and DO.

In the MR sensor in FIG. 9, depending on the positional relation between scale structure 69 and MR sensor 601, the output signals AO, BO, CO and DO are converted to sine waves, having four-phased waveform, having the central voltage Vm, and having an amplitude 2Vp. These four-phased signals AO, BO, CO and DO are adjusted as to their amplitude and offset voltage, etc. through amplifiers 602, 603, 604 and 605, and digitized by A/D converters 606, 607, 608 and 609 as shown in FIG. 8, and are applied to CPU 610. The foregoing output signals AO, BO, CO and DO are expressed in the form of the following formulas, where x is the phase:

AO=Vp·sin $(2\pi \cdot x/P)$+Vm

BO=Vp·sin $(2\pi \cdot (x+\frac{1}{8} \cdot P)/P)$+Vm

CO=Vp·sin $(2\pi \cdot (x+\frac{2}{8} \cdot P)/P)$+Vm

DO=Vp·sin $(2\pi \cdot (x+\frac{3}{8} \cdot P)/P)$+Vm

In CPU 610, from the four phase signals, computation is performed as to offset voltages, amplitudes, etc., and the following four signals are obtained:

S(1): a=AO/Vp−Vm

S(2): a=BO/Vp−Vm

S(3): a=CO/Vp−Vm

S(4): a=DO/Vp−Vm

Further, by computing such that two signals among four signals S(1) to S(4) are summed up, the following twelve signals S(5) to S(16) are obtained: S(5): a+b; S(6): b+c; S(7): c+d; S(8): d−a; S(9): b−d; S(10): c−d; S(11): a+c; S(12): a+d; S(13): b+d; S(14): b−a; S(15): c−a; S(16): c−b These sixteen signals are also expressed in the following formulas:

S(1): a=sin$(2\pi x/P)$

S(2): b=sin$(2\pi(x+\frac{1}{8} \cdot P)/P)$

S(3): c=sin$(2\pi(x+\frac{2}{8} \cdot P)/P)$

S(4): d=sin$(2\pi(x+\frac{3}{8} \cdot P)/P)$

S(5): a+b=2cos$(-\pi/8)$·sin$(2\pi(x+\frac{1}{16} \cdot P)/P)$

S(6): b+c=2cos$(-\pi/8)$·sin$(2\pi(x+\frac{3}{16} \cdot P)/P)$

S(7): c+d=2cos$(-\pi/8)$·sin$(2\pi(x+\frac{5}{16} \cdot P)/P)$

S(8): d−a=2sin$(3\pi/8)$·cos$(2\pi(x+\frac{3}{16} \cdot P)/P)$ =2sin$(3\pi/8)$·sin$(2\pi(x+\frac{7}{16} \cdot P)/P)$ S(9): b−d=2sin$(-2\pi/8)$·cos$(2\pi(x+\frac{4}{16} \cdot P)/P)$ =2sin$(2\pi/8)$·sin$(2\pi/P)$ S(10): c−d=2sin$(-\pi/8)$·cos$(2\pi(x+\frac{5}{16} \cdot P)/P)$ =2sin$(\pi/8)$·sin$(2\pi(x+\frac{1}{16} \cdot P)/P)$ S(11): a+c=2cos$(-2\pi/8)$·sin$(2\pi(x+\frac{2}{16} \cdot P)/P)$ S(12): a+d=2cos$(-3/8)$·sin$(2\pi(x+\frac{3}{16} \cdot P)/P)$ S(13): b+d=2cos$(-2/8)$·sin$(2\pi(x+\frac{4}{16} \cdot P)/P)$ S(14): b−a=2sin$(\pi/8)$·cos$(2\pi(x+\frac{1}{16} \cdot P)/P)$ =2sin$(\pi/8)$·sin$(2\pi(x+\frac{5}{16} \cdot P)/P)$ S(15): c−a=2sin$(2\pi/8)$·cos$(2\pi(x+\frac{2}{16} \cdot P)/P)$ =2sin$(2\pi/8)$·sin$(2\pi(x+\frac{6}{16} \cdot P)/P)$ S(16): c−b=2sin$(\pi/8)$·cos$(2\pi(x+\frac{3}{16} \cdot P)/P)$ =2sin$(\pi/8)$·sin$(2\pi(x+\frac{7}{16} \cdot P)/P)$ Accordingly, detection of the position information at zero-cross point of these sixteen signals permits the position detection with an accuracy of $\frac{1}{16}$th the magnetizing pitch P of the scale structure 69.

Hereinafter, a method of determining reliability on the above-mentioned position information is described.

Among the 16 signals, there are each two signals having, in principle, the same phase, for example, S(1) and S(9). Thus, utilizing the same phase two signals in principle, reliability determination is performed. Of two signals, when the value of either one becomes zero, and (1) the remaining signal value (absolute value) is smaller than the pre-determined value, it is determined the error of the position information is small and the value is established as the position information. (2) When the remaining signal has a value exceeding the predetermined value, then, under the determination that the error is large, the value would not be used as the position information: in this case, calibration of the offset voltage Vm or amplitude Vp is conducted, that is, the values of Vm and Vp are modified in CPU 110, and S(1) to S(4) are again recalculated and S(5) to S(16) are again re-calculated to detect the position information.

Further, the same phase signals S(n) and S(n+8), (where n=1, 2, . . . 8), are adjusted so as to have the same amplitude to each other, and thereafter summed with each other, and, using the zero-cross point of the summed signals to obtain the position information, the position detection with the lowered error component is possible, and reliability is increased.

Figure 12:
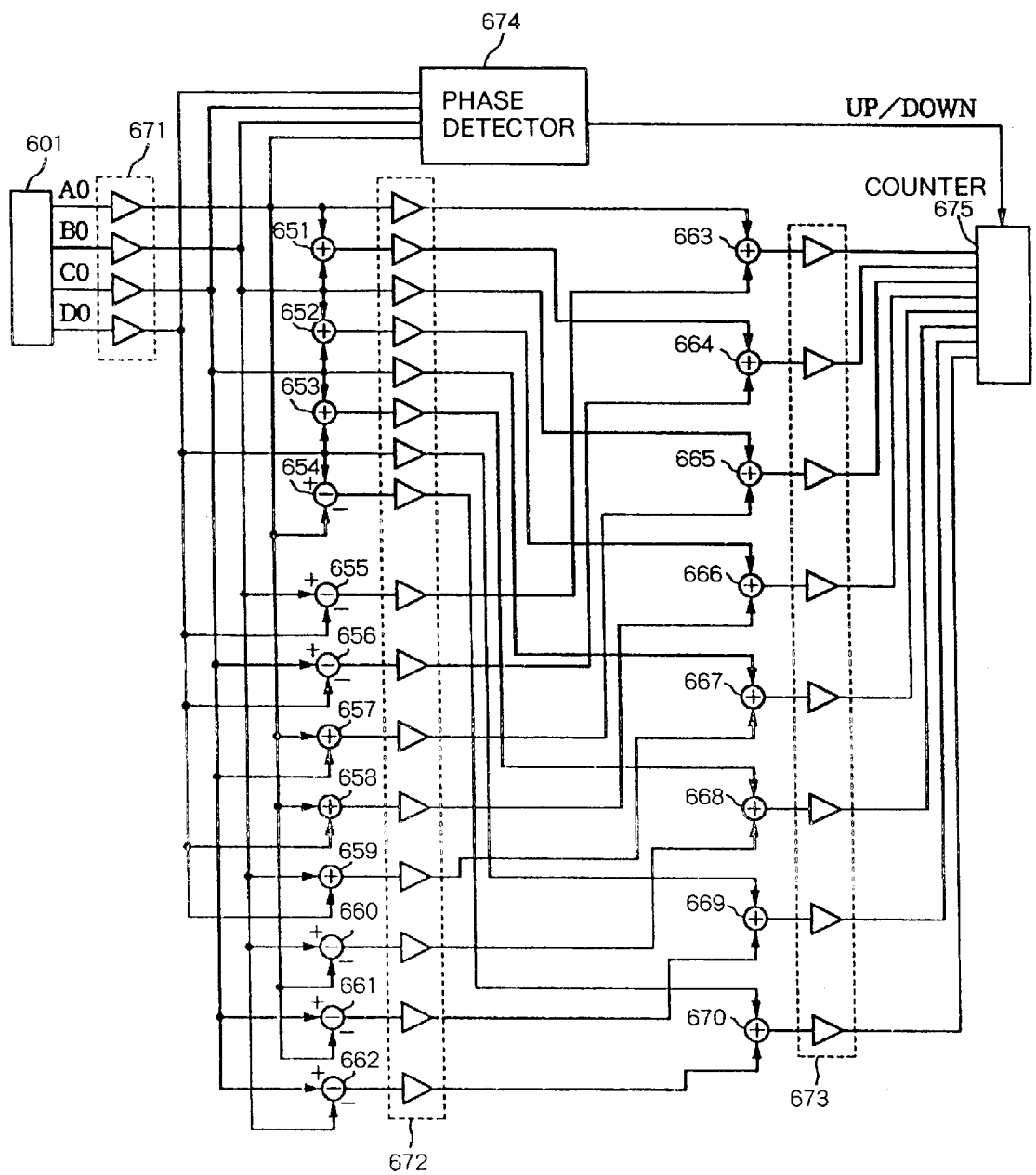
FIG. 12 is a circuit diagram of a hardware in a position sensor apparatus for computing 16 output signals.
Figure 13:
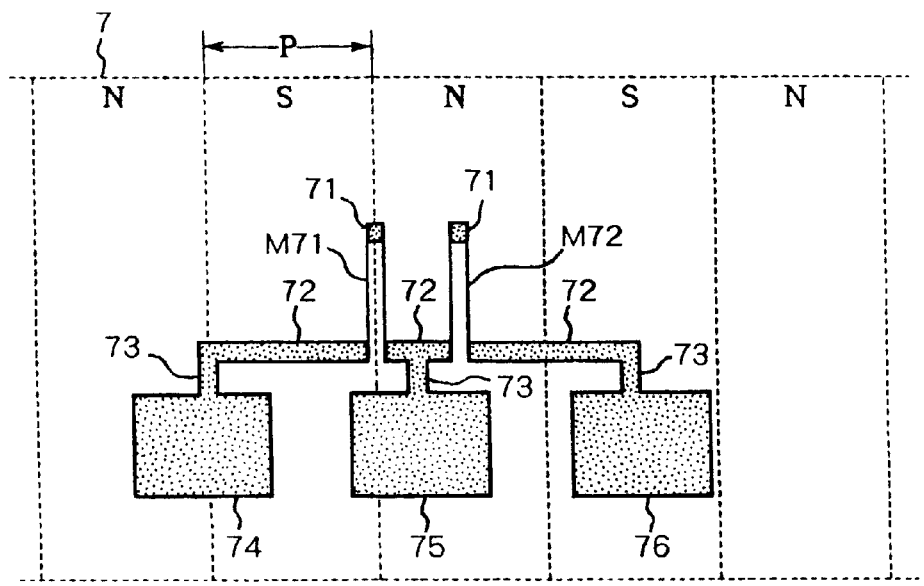
FIG. 13 is a pattern of a MR device of the first conventional example.
Figure 14:
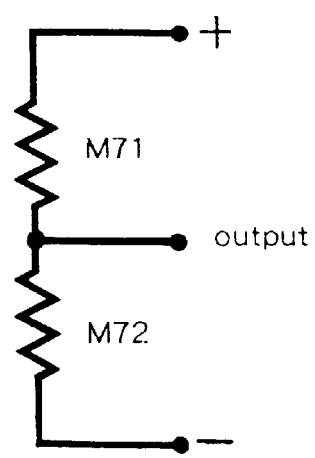
FIG. 14 is an equivalent circuit to the second conventional MR device.
Figure 15:
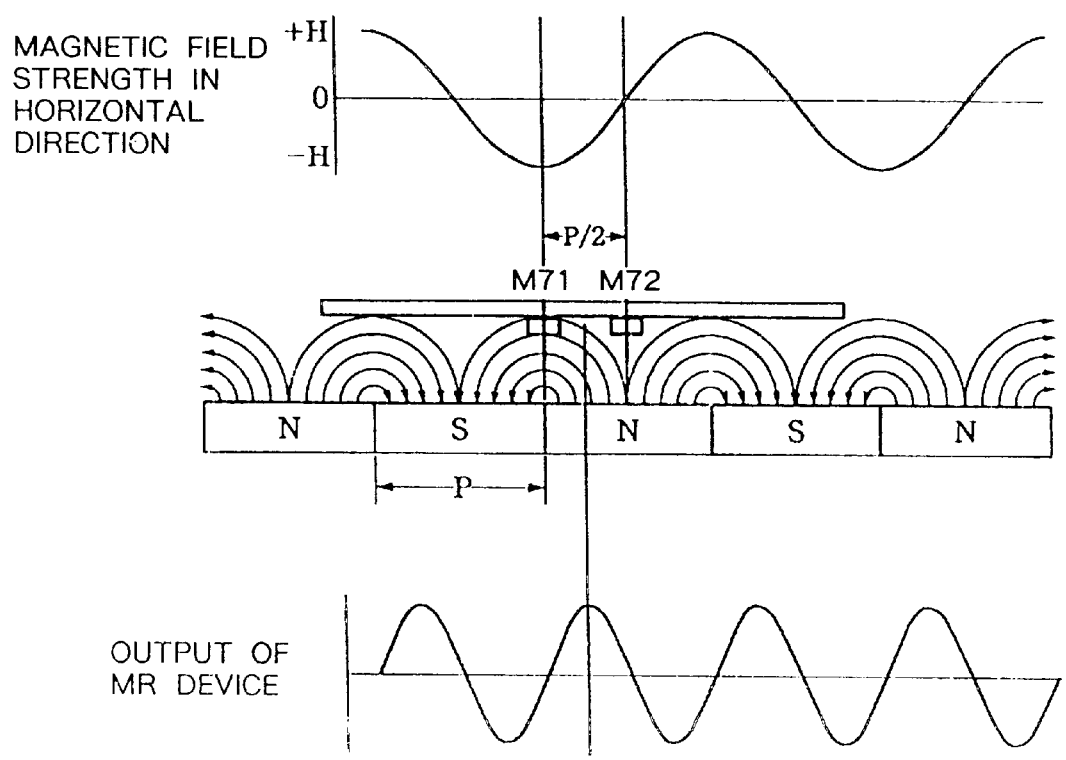
FIG. 15 is an illustration of the relationship between magnetic sensing elements of a MR device and magnetic poles in the magnet, and an output signal waveform of the MR device.
Figure 16:
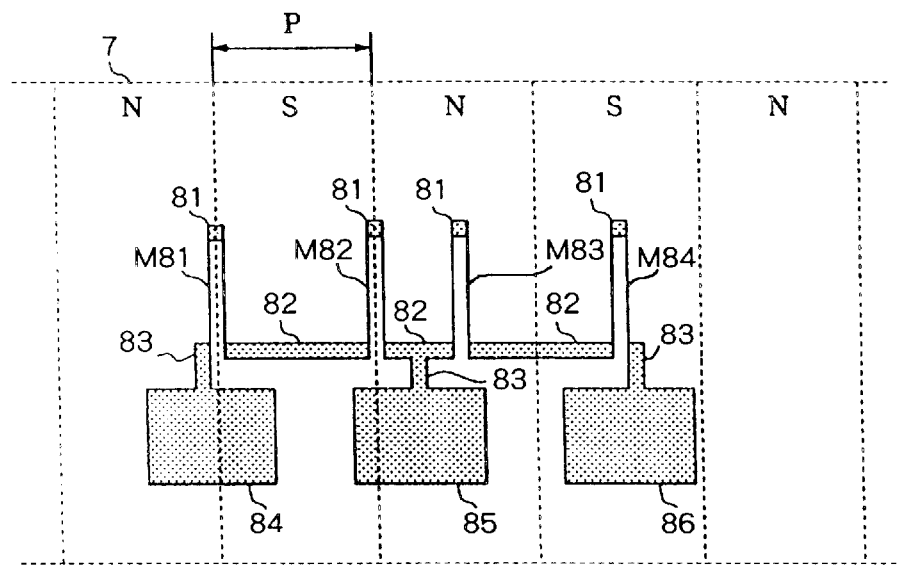
FIG. 16 is a pattern of a MR device of the second conventional example.
Figure 17:
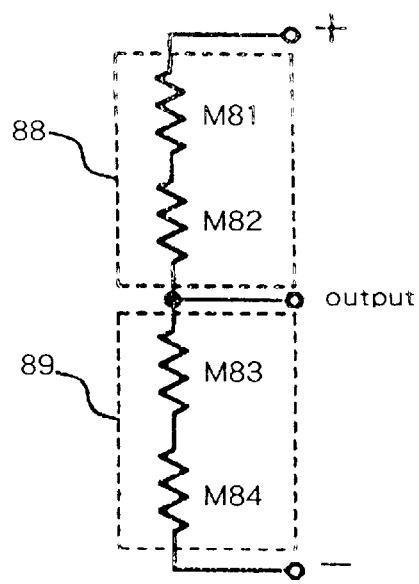
FIG. 17 is an equivalent circuit to the second conventional example.
Figure 18:
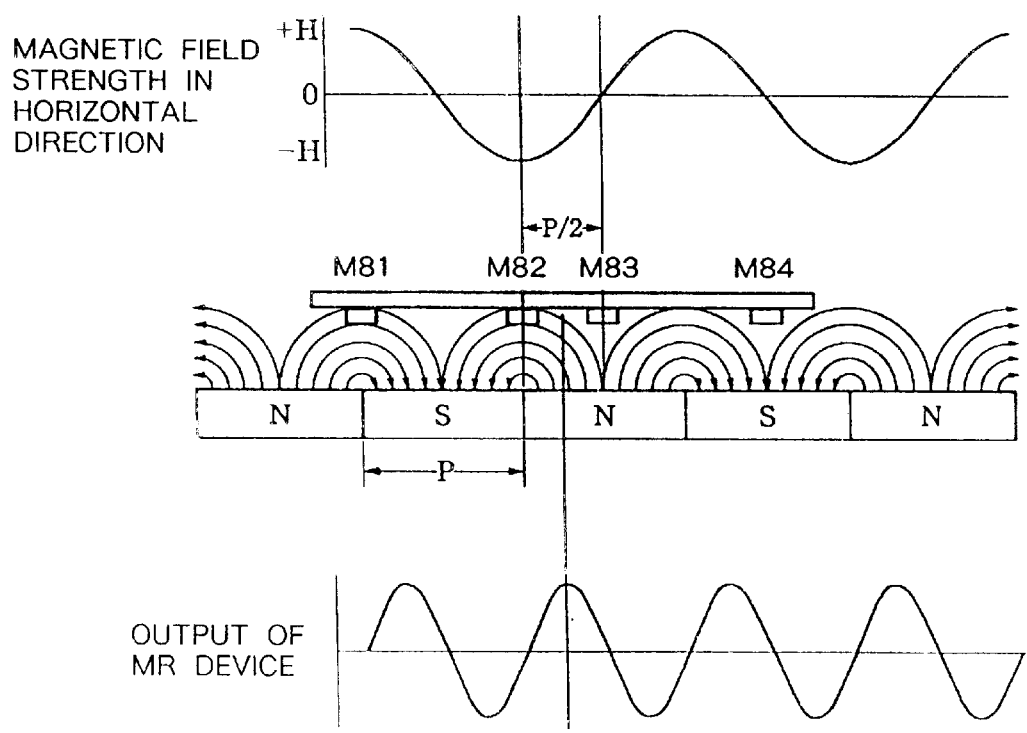
FIG. 18 is an illustration of the relationship between magnetic sensing elements of a MR device and magnetic poles in the magnet, and an output signal waveform of the MR device.
Figure 19:
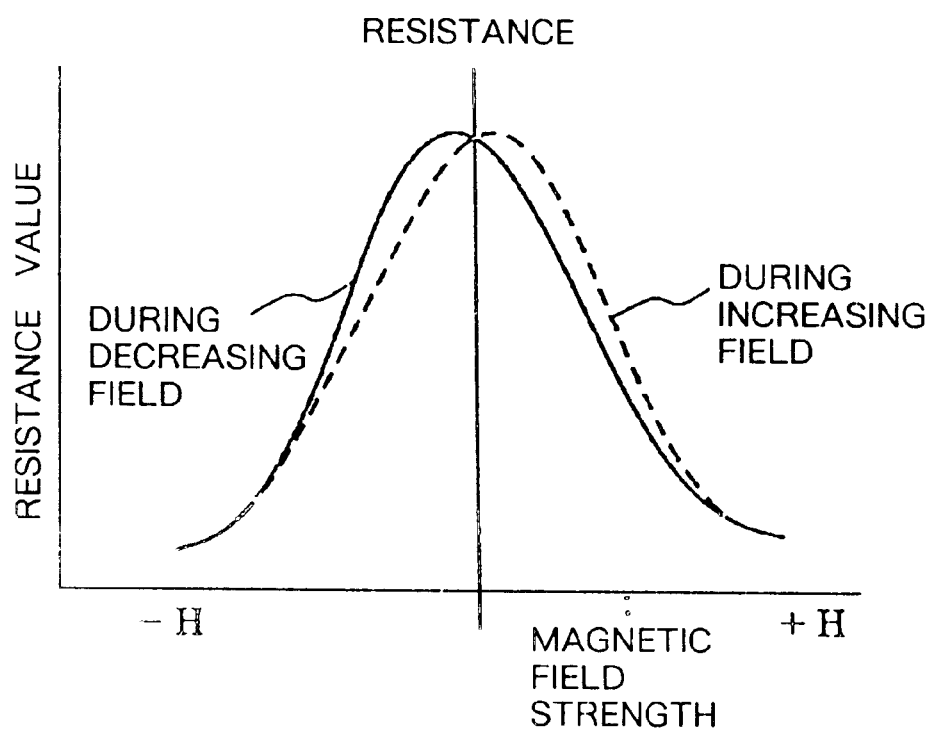
FIG. 19 is a diagrammatic illustration of the resistance change of the MR device in accordance with increasing or decreasing magnetic field intensity, when applied by a magnetic field in the direction orthogonal to the MR device.

Although all the computations are carried out on the software basis using CPU 610 in the above embodiment, with further rapidly the position is detected if using a hardware circuit. FIG. 12 is a position detecting circuit in which all operations including the calculation of the 16 signals have been realized by the hardware circuit.

In FIG. 12, it is shown a MR sensor 601, adders 651, 652, 653, 657, 658, 659, and 663 to 670; subtracters 654, 655, 656, 660, 661 and 662; amplifiers 671 and 672; a comparator 673; a phase detector 674; and a counter 675. The output of MR sensor 601 is amplified and processed in amplifier 671, and computed in adders and subtracters, and the sixteen signals are produced in the analog form. Each of an adder and a subtracter is composed of differential amplifiers and resistors. After adjustment of amplitude, etc. in amplifier 672, in principle, the same phased signals are added together in adder 663, namely, the signal S(1) with S(9), or in adder 664 the signal S(2) with S(10). The added signal is waveform-corrected and converted to a pulse wave by the comparator 673, and applied to counter 675, which counts the leading and trailing edges of the applied signal wave, where-in the count is controlled so as to either increase or decrease the count according to the output signal of phase detector 674. From the phase condition of a plurality of output signals AO, BO, CO and DO of MR sensor 601, the phase detector 674 determines the moving direction along which the movement is caused, to control the counter 675. Through the process, the absolute position of an object can be detected with a resolution ability corresponding to 1/16th the pole pitch of scale structure 69.

Also, it can be understood that the same phased signals among output signals from the amplifier 672 may be compared to each other to determine the reliability of the position information.

In all cases it is understood that the above-described arrangements are merely illustrative of the many possible specific embodiments which represent applications of the present invention. Numerous and varied other arrangements, can be readily devised in accordance with the principles of the present invention without departing from the spirit and scope of the invention.

What is claimed is:

1. A magnetic resistance effect device comprising:

a plurality of magnetic sensing groups, each of said magnetic sensing groups including at least two magnetic sensing elements, each of whose resistance value is variable in response to a magnetic field generated in a scale structure including a plurality of magnetic poles of alternating polarity and equal width arranged serially in the longitudinal direction of the scale structure, said at least two magnetic sensing elements arranged spaced apart from each other by substantially the same distance as a width of the magnetic poles, each of said sensing groups arranged spaced apart from each other by substantially an integer multiple of a half of the width of the magnetic poles, wherein a voltage is applied to both outermost said magnetic sensing elements of a pair of consecutive magnetic sensing groups and an output is obtained from a connection between intermediate magnetic sensing elements of said pair of sensing groups; and each sensing group including a wiring group comprising a plurality of wiring leads for applying said voltage and obtaining said output, each wiring group including among said wiring leads, leads arranged in the direction orthogonal to the longitudinal direction of the scale structure including a first lead associated with the outermost sensing element of the sensing group and a second lead associated with the intermediate sensing element of the sensing group and spaced from the first lead by an integer multiple of the width of the magnetic poles.

2. A magnetic resistance effect element according to claim 1, wherein, the positional relationship between said magnetic sensing elements, included in said sensing group, and said wiring arrangement, in the direction orthogonal to said magnetic field of said scale structure, being formed away from each other by the amount of c times the width, where "c" is an integer such as 0, 1, 2, or more.

3. A magnetic resistance effect element according to claim 2, wherein said magnetic sensing elements and wiring arrangement are formed of a ferromagnetic thin film.

4. A magnetic resistance effect element according to claim 1, wherein said magnetic sensing elements and wiring arrangement are formed of a ferromagnetic thin film.

5. A position sensing apparatus comprising:

(a) a scale structure including a plurality of magnetic poles of alternating polarity and equal width arranged serially in the longitudinal direction of the scale structure;

(b) a plurality of magnetic sensing groups constituted by sensing element groups having at least two sensing elements spaced apart from each other by essentially the same width as the width of the magnetic poles, and each of said magnetic sensing groups arranged spaced apart from each other by the distance of an integer multiple of a half of the width of said magnetic poles, and a voltage being applied to both outermost said magnetic sensing elements of a pair of consecutive sensing groups, and an output being obtained from a connection between intermediate magnetic sensing elements of a pair of consecutive magnetic sensing groups;

wherein each said sensing group including a wiring group including wiring leads necessary for applying said voltage and obtaining said output, each wiring group including, among said wiring leads, leads arranged in the direction orthogonal to the longitudinal direction of the scale structure including a first lead associated with the outermost sensing element of the sensing group and a second lead associated with the intermediate sensing element of the sensing group and spaced from the first lead by an integer multiple of the width of the magnetic poles.

6. A position sensing apparatus according to claim 5, wherein the positional relationship between said magnetic sensing elements, included in said sensing group, and said wiring arrangement, in the direction orthogonal to said magnetic field of said scale structure, being formed away from each other by the amount of "f" times the pole width, where "f" is an integer such as 0, 1, 2, or more.

7. A position sensing apparatus according to claim 6, wherein said magnetic sensing elements and external connecting terminals are formed of a ferromagnetic thin film.

8. A position sensing apparatus according to claim 5, wherein said magnetic sensing elements and external connecting terminals are formed of a ferromagnetic thin film.

* * * * *

UNITED STATES PATENT AND TRADEMARK OFFICE
CERTIFICATE OF CORRECTION

PATENT NO. : 6,307,366 B1
DATED : October 23, 2001
INVENTOR(S) : Nobuhiro Takeda It is certified that error appears in the above-identified patent and that said Letters Patent is hereby corrected as shown below:

Column 1,
Line 40, delete "contact," and insert -- contact type --.

Column 3,
Line 3, delete "formed. With" and insert -- formed with --.
Line 6, delete "position 10 information," and insert -- position information, --.

Column 7,
Line 9, delete "distance p" and insert -- distance P --.
Line 28, delete "Connection" and insert -- Connecting --.

Column 10,
Line 7, delete "the-" and insert -- the --.

Column 11,
Line 19, delete "shifted" and insert -- difference --.
Line 50, delete "S(2): a=" and insert -- S(2): b= --.
Line 51, delete "S(3): a" and insert -- S(3): c= --.
Line 52, delete "S(4): a" and insert -- S(4): d= --.

Column 14,
Line 4, delete "claim 2" and insert -- claim 1 --.

Signed and Sealed this

Tenth Day of September, 2002

*Attest:*

*Attesting Officer*

JAMES E. ROGAN
*Director of the United States Patent and Trademark Office*